(12) United States Patent
Nakamura

(10) Patent No.: US 10,995,928 B2
(45) Date of Patent: May 4, 2021

(54) LIGHT EMITTING SYSTEM

(71) Applicant: PIONEER CORPORATION, Tokyo (JP)

(72) Inventor: Takeshi Nakamura, Kawagoe (JP)

(73) Assignee: PIONEER CORPORATION, Kawasaki (JP)

(*) Notice: Subject to any disclaimer, the term of this patent is extended or adjusted under 35 U.S.C. 154(b) by 0 days.

(21) Appl. No.: 16/095,030

(22) PCT Filed: Apr. 5, 2017

(86) PCT No.: PCT/JP2017/014229
§ 371 (c)(1),
(2) Date: Oct. 19, 2018

(87) PCT Pub. No.: WO2017/187913
PCT Pub. Date: Nov. 2, 2017

(65) Prior Publication Data
US 2019/0157602 A1    May 23, 2019

(30) Foreign Application Priority Data
Apr. 25, 2016  (JP) .............................. JP2016-087482

(51) Int. Cl.
*H01L 51/52*    (2006.01)
*H01L 27/32*    (2006.01)
*F21S 43/145*   (2018.01)
*H05B 33/08*    (2020.01)

(52) U.S. Cl.
CPC ........ *F21S 43/145* (2018.01); *H01L 27/3276* (2013.01); *H01L 27/3297* (2013.01);
(Continued)

(58) Field of Classification Search
CPC ............. H01L 51/5203; H01L 27/3276; H01L 27/3297; H01L 51/5284; H01L 51/5237;
(Continued)

(56) References Cited

U.S. PATENT DOCUMENTS

| | | | |
|---|---|---|---|
| 7,505,188 B2 | 3/2009 | Niiyama et al. |
| 8,575,833 B2 | 11/2013 | Kim |
| 9,985,239 B2 | 5/2018 | Ruske et al. |
| 2006/0291030 A1 | 12/2006 | Niiyama et al. |
| 2012/0161613 A1 | 6/2012 | Kim |

(Continued)

FOREIGN PATENT DOCUMENTS

| | | |
|---|---|---|
| DE | 20207799 U1 | 8/2002 |
| JP | 2007-004085 A | 1/2007 |

(Continued)

OTHER PUBLICATIONS

International Search Report for related International Application No. PCT/JP2017/01429, dated Jun. 27, 2018; English Translation provided; 4 pages.

*Primary Examiner* — David Vu
(74) *Attorney, Agent, or Firm* — Procopio, Cory, Hargreaves & Savitch LLP

(57) ABSTRACT

The base member (300) has a light transmitting property. The light emitting element (20) is on the inner surface (302) of the base member (300). The light emitting element (20) includes a light emitting portion (142) and a light transmitting portion (144). A plurality of wirings (222) of the first sheet 202 and a plurality of wirings (222) of the second sheet (204) are on the surface of the base member (300). The plurality of wirings (222) of the first sheet (202) is electrically connected to an anode (first terminal (112)) of the light emitting element (20). The plurality of wirings (222) of the second sheet (204) is electrically connected to a cathode (second terminal (132)) of the light emitting element (20).

15 Claims, 16 Drawing Sheets

(52) U.S. Cl.
CPC ...... *H01L 51/5203* (2013.01); *H01L 51/5206* (2013.01); *H01L 51/5221* (2013.01); *H01L 51/5237* (2013.01); *H01L 51/5284* (2013.01); *H05B 33/08* (2013.01); *H01L 27/3202* (2013.01); *H01L 2251/5361* (2013.01); *H01L 2251/5392* (2013.01)

(58) Field of Classification Search
CPC ............. H01L 51/5221; H01L 51/5206; H01L 2251/5392; H01L 2251/5361; H01L 27/3202; H05B 33/08; F21S 43/145; F21S 43/00
See application file for complete search history.

(56) References Cited

U.S. PATENT DOCUMENTS

| | | | |
|---|---|---|---|
| 2014/0003072 A1 | 1/2014 | Yamamoto et al. | |
| 2014/0166991 A1 | 6/2014 | Nikonov et al. | |
| 2014/0299866 A1 | 10/2014 | Ruske et al. | |
| 2015/0076472 A1* | 3/2015 | Yamazaki | H01L 27/326 257/40 |

FOREIGN PATENT DOCUMENTS

| | | |
|---|---|---|
| JP | 2014-008877 A | 1/2014 |
| JP | 2014-150040 A | 8/2014 |
| JP | 2014-531126 A | 11/2014 |
| JP | 2015-220026 A | 12/2015 |
| KR | 10-2011-0003698 A | 1/2011 |
| WO | 00/070639 A1 | 11/2000 |
| WO | 2016/128139 A1 | 8/2016 |

* cited by examiner

LIGHT EMITTING SYSTEM

CROSS-REFERENCE TO RELATED APPLICATIONS

This application is a U.S. National Stage entry of PCT Application No: PCT/JP2017/014229 filed Apr. 5, 2017, which claims priority to Japanese Patent Application No. 2016-087482, filed Apr. 25, 2016, the contents of which are incorporated herein by reference.

TECHNICAL FIELD

The present invention relates to a light emitting system.

BACKGROUND ART

In recent years, as described in Patent Document 1, for example, a light emitting element having a light transmitting property may be attached to a rear window of a moving object. As such a light emitting element, a semi-transmissive organic light emitting diode (OLED) is currently being developed. The semi-transmissive OLED has a light emitting element including a light emitting portion and a light transmitting portion, and allows the light emission of the light emitting portion from only one side. Such a configuration allows the semi-transmissive OLED to serve as a lamp that emits light in an outer direction of the moving object when semi-transmissive OLED is attached to the rear window of the moving object, and enables visual contact, from the inside of the moving object, with the outside of the moving object regardless of the light emitting state.

When the semi-transmissive OLED is attached to the rear window of the moving object, it is necessary to supply electric power from the outside of the light emitting element or the light emitting portion to drive the light emitting element or the light emitting portion of the semi-transmissive OLED. In Patent Document 2, electric power is supplied to a light emitting element or a light emitting portion through a heating wire (defogger) of the rear window.

RELATED DOCUMENT

Patent Document

[Patent Document 1] Japanese Unexamined Patent Publication No. 2015-220026
[Patent Document 2] Japanese Unexamined Patent Publication No. 2014-008877

SUMMARY OF THE INVENTION

As mentioned above, the semi-transmissive OLED may be attached to the rear window of the moving object, for example. In this case, it is necessary to supply the electric power from the outside of the light emitting element or the light emitting portion through the wiring (for example, the heating wire of Patent Document 2) to drive the light emitting portion of the semi-transmissive OLED. In this case, in consideration of the visibility of the inside of the moving object to the outside, and the design of the moving object, the rear window of the moving object, and the semi-transmissive OLED attached to the rear window when viewed from inside and outside the moving object, it is desirable to reduce conspicuousness of the wiring as much as possible.

One example of objects of the present invention is to reduce conspicuousness of a wiring for supplying electric power to the light emitting system or the light emitting portion from the outside of the light emitting system to human vision.

Means for Solving the Problem

The invention according to claim 1 is a light emitting system comprising:
a base member having a light transmitting property;
a light emitting portion located over a surface of the base member or inside the base member;
a light transmitting portion located over the surface of the base member or inside the base member; and
a plurality of first wirings located over the surface of the base member or inside the base member and each electrically connected to one of an anode or a cathode of the light emitting portion.

BRIEF DESCRIPTION OF THE DRAWINGS

The above-described object, other objects, features, and advantages will become more apparent from the preferred embodiments described below and the accompanying drawings.

DESCRIPTION OF EMBODIMENTS

Figure 1:
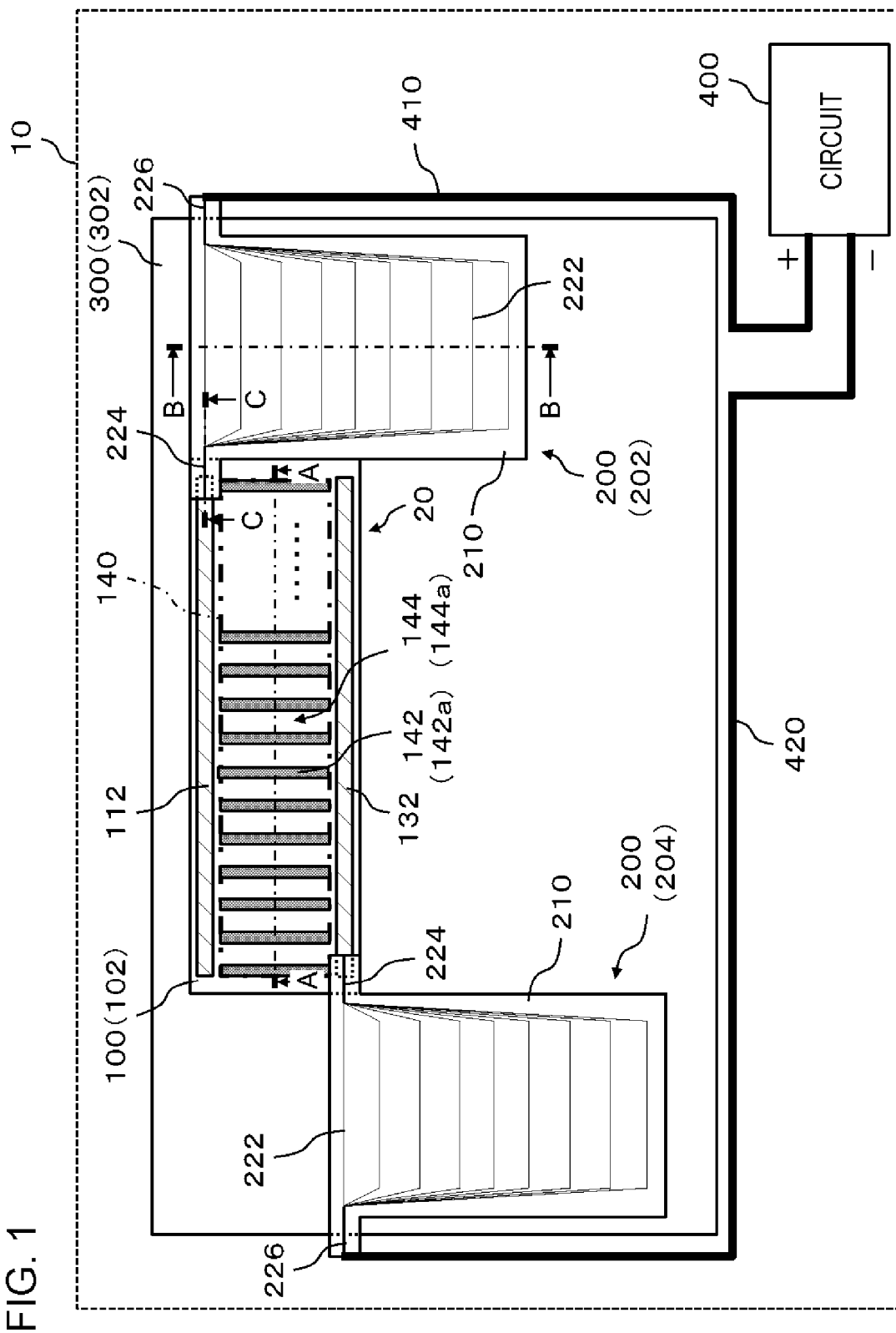
FIG. 1 is a view illustrating a light emitting system according to an embodiment.

Embodiments of the present invention are described below with reference to the drawings. In all the drawings, the similar components are denoted by the similar reference numerals, and a description thereof will not be repeated.

Figure 2:
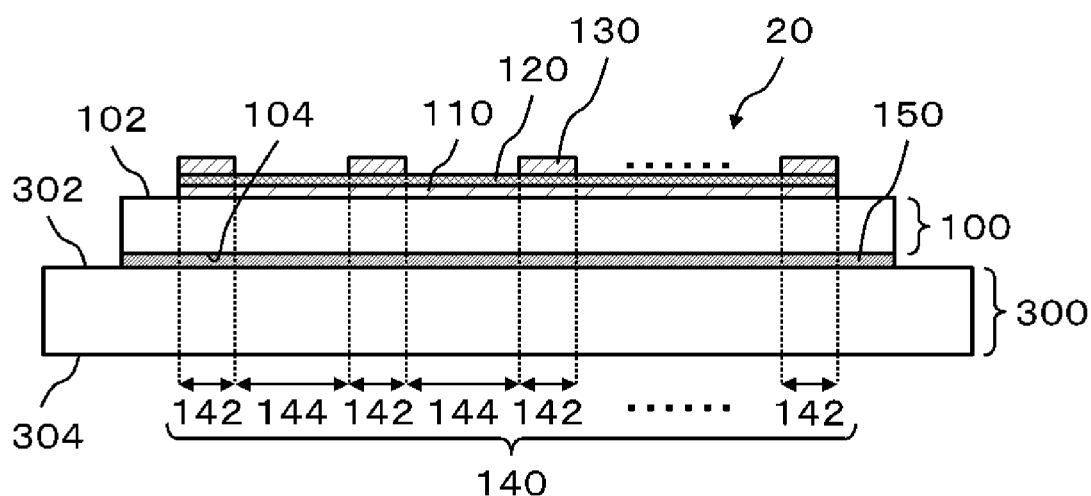
FIG. 2 is a cross-sectional view taken along line A-A in FIG. 1.
Figure 3:
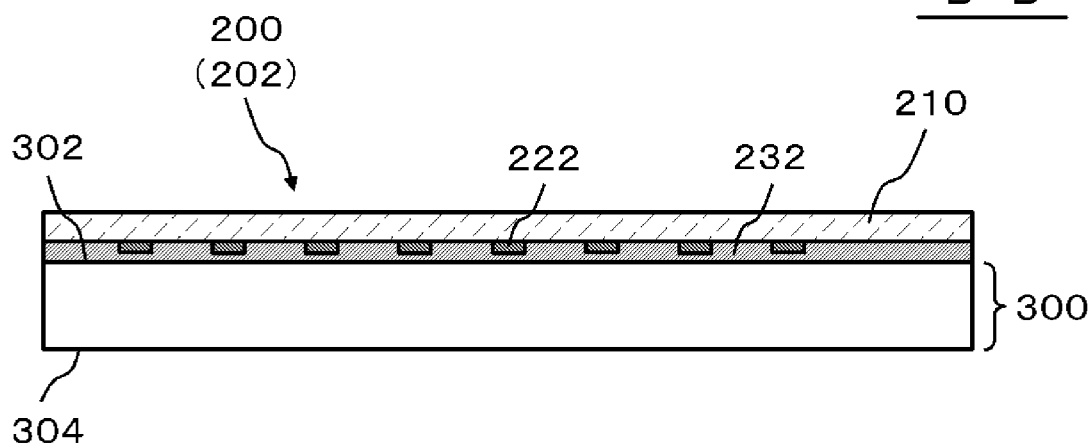
FIG. 3 is a cross-sectional view taken along line B-B in FIG. 1.
Figure 4:
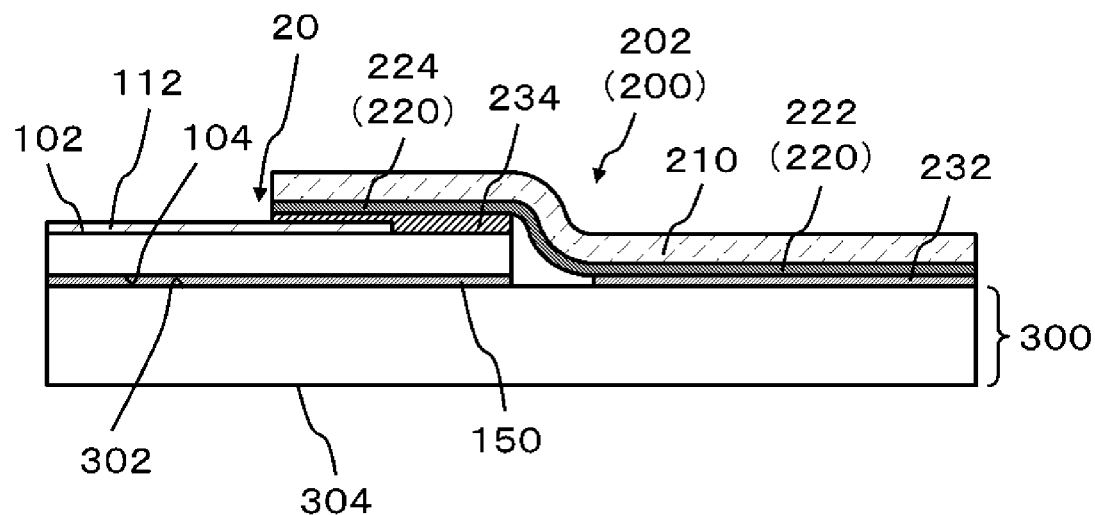
FIG. 4 is a cross-sectional view taken along line C-C in FIG. 1.

FIG. 1 is a view illustrating a light emitting system 10 according to an embodiment. FIG. 2 is a cross-sectional view taken along line A-A in FIG. 1. FIG. 3 is a cross-sectional view taken along line B-B in FIG. 1. FIG. 4 is a cross-sectional view taken along line C-C in FIG. 1. The light emitting system 10 includes a light emitting element 20, a plurality of wirings 222 (a plurality of wirings 222 of a first sheet 202 and a plurality of wirings 222 of a second sheet 204) and a base member 300. The base member 300 has a light transmitting property. The light emitting element 20 is on a surface (inner surface 302) of the base member 300. The light emitting element 20 includes a light emitting portion 142 and a light transmitting portion 144. The plurality of wirings 222 (the first wirings) of the first sheet 202 and the plurality of wirings 222 (the second wirings) of the second sheet 204 are on the surface (the inner surface 302) of the base member 300. The plurality of wirings 222 of the first sheet 202 is electrically connected to an anode of the light emitting element 20 (a first electrode 110 and a first terminal 112). The plurality of wirings 222 of the second sheet 204 is electrically connected to a cathode of the light emitting element 20 (a second electrode 130 and a second terminal 132). Detailed explanation will follow.

The light emitting system 10 includes a light emitting element 20, two sheets 200 (a first sheet 202 and a second sheet 204), a base member 300, a circuit 400, an anode wiring 410, and a cathode wiring 420. The light emitting element 20 includes a substrate 100, a first terminal 112, a second terminal 132, a light emitting portion 142, and a light transmitting portion 144. The sheets 200 include a base sheet 210, a wiring 222, a conductive portion 224 and a conductive portion 226. The circuit 400 is a circuit for supplying electric power to the light emitting element 20 or the light emitting portion 142, and specifically, the circuit 400 generates a voltage for driving the light emitting element 20 or the light emitting portion 142 between the anode wiring 410 and the cathode wiring 420.

In this embodiment, the base member 300 is mounted on a moving object such as a vehicle, or specifically, is a rear window of the vehicle. In other words, the base member 300 is formed of one or a plurality of pieces of glasses. The base member 300 has an inner surface 302 and an outer surface 304. The inner surface 302 faces the inside of the vehicle. The outer surface 304 faces the outside of the vehicle. However, the base member 300 is not limited to the rear window of the vehicle. For example, the base member 300 may be a front window or a side window of the vehicle. Further, the base member 300 may be a window of a moving object other than the vehicle (for example, a train or an airplane). Hereinafter, description will be given on the assumption that the base member 300 is the rear window of the vehicle.

The substrate 100 has a first surface 102 and a second surface 104. The second surface 104 is opposite to the first surface 102. In the example shown in FIG. 1, the shape of the first surface 102 is a rectangle. The shape of the first surface 102 may be a shape other than the rectangle. The substrate 100 has a light transmitting property and is formed of glass or resin, for example.

The light emitting portion 142 and the light transmitting portion 144 are located on the first surface 102 of the substrate 100. An area of the semi-transmissive light emitting region 140 in the light emitting element 20, which is a combination of the light emitting region (light emitting region 142a) where the light emitting portion 142 emits light, and the light transmitting region (light transmitting region 144a) where the light transmitting portion 144 is located, is smaller than an area of the first surface 102 of the substrate 100, and any part of the light emitting region 142a and the semi-transmissive light emitting region 140 is positioned inside the first surface 102 of the substrate 100. When the light emitting portion 142 is formed in a stripe shape, the region sandwiched between the light emitting region 142a of the light emitting portions 142 located on the outermost side and the light emitting portions 142 are referred to as the semi-transmissive light emitting region 140 of the light emitting element 20 or light emitting system 10. In the example shown in FIG. 2, the substrate 100 is attached to the base member 300 such that the second surface 104 faces the inner surface 302 of the base member 300. In other words, in the example shown in FIG. 2, the light emitting element 20 is positioned inside the vehicle. In addition, in the example shown in FIG. 2, the second surface 104 of the substrate 100 and the inner surface 302 of the base member 300 are adhered to each other through an adhesive layer 150. The adhesive layer 150 has a light transmitting property. Accordingly, light from the light emitting portion 142 of the light emitting element 20 can be transmitted through the adhesive layer 150, and it is possible to visually recognize the outside from the inside of the vehicle, regardless of whether or not the light emitting system 10, the light emitting element 20, or the light emitting portion 142 emits light.

The light emitting element 20 has a plurality of light emitting portions 142 and a plurality of light transmitting portions 144. The plurality of light emitting portions 142 and the plurality of light transmitting portions 144 are alternately arranged in a row. The shape of each light emitting portion 142 is a rectangle having a pair of long sides and a pair of short sides. In the example shown in FIG. 1, the long side of the light emitting portion 142 extends in a direction crossing (specifically, orthogonal to) the row direction of the plurality of light emitting portions 142. In other words, the plurality of light emitting portions 142 is arranged in stripe shape or stripe form.

In the example shown in FIG. 1, the shape of the semi-transmissive light emitting region 140 is defined as a rectangle having a pair of long sides and a pair of short sides. More specifically, the long sides of the semi-transmissive light emitting region 140 overlap with the short sides of the plurality of light emitting portions 142. One short side of the semi-transmissive light emitting region 140 overlaps with the outer long side of the four sides of the light emitting portion 142 at one end of the plurality of light emitting portions 142. The other short side of the semi-transmissive light emitting region 140 overlaps with the outer long side of the four sides of the light emitting portion 142 at the other end of the plurality of light emitting portions 142.

In the example shown in FIGS. 1 and 2, the light emitting element 20 is a semi-transmissive OLED. Most of the light from the light emitting element 20 is emitted from the second surface 104 side, and light from the light emitting element 20 is hardly emitted from the first surface 102 side. In this way, light from the light emitting element 20 is emitted toward the outside of the vehicle. When light is emitted from the light emitting element 20, human vision perceives as if the light is emitted throughout the entire surface of the semi-transmissive light emitting region 140 from the second surface 104 side of the substrate 100 or the outer surface 304 of the base member 300. When light is not emitted from the light emitting element 20, human vision perceives that an object on the first surface 102 side of the substrate 100 is seen through from the second surface 104 side of the substrate 100 or the outer surface 304 of the base member 300. An object on the second surface 104 side of the substrate 100 may be seen through from the first surface 102 of the substrate 100 regardless of whether the light emitting system 10, the light emitting element 20, or the light emitting portion 142 emits light.

More specifically, the light emitting system 10 or the light emitting element 20 includes a first electrode 110, an organic layer 120, and a plurality of second electrodes 130. The first electrode 110 is on the first surface 102 of the substrate 100. The organic layer 120 is on the first electrode 110. The plurality of second electrodes 130 is formed on the organic layer 120. In the light emitting system 10 or the light emitting element 20, the light emitting portion 142 is in a region where the first electrode 110, the organic layer 120 and the second electrode 130 overlap with each other. In the example shown in FIGS. 1 and 2, the first electrode 110 and the organic layer 120 are located throughout the entire semi-transmissive light emitting region 140 to form a semi-transmissive light emitting region 140. Accordingly, the light emitting portion 142 is in the region overlapped with the second electrode 130.

The first electrode 110 is formed of a conductive material having a light transmitting property, for example, a metal-containing material such as a metal oxide, more specifically, for example, Indium Tin Oxide (ITO), Indium Zinc Oxide (IZO), Indium Tungsten Zinc Oxide (IWZO) or Zinc Oxide (ZnO).

The first electrode 110 is electrically connected to the first terminal 112. The first terminal 112 is electrically connected to the circuit 400 through the conductive portion 224 of the first sheet 202, the plurality of wirings 222 of the first sheet 202, the conductive portion 226 of the first sheet 202, and the anode wiring 410. In this way, the first electrode 110 is electrically connected to the circuit 400 through the first terminal 112, the conductive portion 224, the plurality of wirings 222, the conductive portion 226, and the anode wiring 410.

The organic layer 120 emits light with the voltage between the first electrode 110 and the second electrode 130. Specifically, the organic layer 120 has, for example, a hole injection layer, a hole transport layer, a light emitting layer, an electron transport layer, and an electron injection layer. The hole injection layer and the hole transport layer are connected to the first electrode 110, and the electron injection layer and the electron transport layer are connected to the second electrode 130. One of the hole injection layer and the hole transport layer may be eliminated. In addition, one of the electron injection layer and the electron transport layer may be eliminated.

The second electrode 130 is formed of a material that reflects light, for example, a metal. More specifically, the second electrode 130 includes a metal selected from the first group consisting of Al, Au, Ag, Pt, Mg, Sn, Zn and In, or an alloy of the metals selected from the first group. Accordingly, the light from the organic layer 120 is not transmitted through the second electrode 130, and is emitted from the second surface 104 side of the substrate 100 through the first electrode 110.

The second electrode 130 is electrically connected to the second terminal 132. The second terminal 132 is electrically connected to the circuit 400 through the conductive portion 224 of the second sheet 204, the plurality of wirings 222 of the second sheet 204, the conductive portion 226 of the second sheet 204, and the cathode wiring 420. In this way, the second electrode 130 is electrically connected to the circuit 400 through the second terminal 132, the conductive portion 224, the plurality of wirings 222, the conductive portion 226, and the cathode wiring 420.

As shown in FIG. 1, each of the sheets 200 (the first sheet 202 and the second sheet 204) is arranged not to overlap with the semi-transmissive light emitting region 140 of the light emitting element 20. As shown in FIGS. 3 and 4, the sheet 200 has a base sheet 210, a conductive layer 220, an adhesive layer 232, and a conductive adhesive layer 234. The conductive layer 220 includes a plurality of wirings 222, a conductive portion 224, and a conductive portion 226.

The plurality of wirings 222 is a part of the conductive layer 220, the conductive portion 224 is another part of the conductive layer 220, and the conductive portion 226 is yet another part of the conductive layer 220.

The base sheet 210 has flexibility and is formed of resin, for example. Accordingly, as shown in FIG. 4, the base sheet 210 can be bent from the substrate 100 to the outside of the substrate 100. The base sheet 210 is formed of insulating material.

The conductive layer 220 is on the surface of the base sheet 210. As shown in FIG. 4, the conductive portion 224 of the conductive layer 220 is electrically connected to the first terminal 112 through the conductive adhesive layer 234. In the same way, the conductive portion 224 of the second sheet 204 is electrically connected to the second terminal 132. As shown in FIG. 3, the plurality of wirings 222 is covered with an adhesive layer 232. The base sheet 210 is adhered to the inner surface 302 of the base member 300 through the adhesive layer 232.

The sheet 200 has a region having a light transmitting property between adjacent wirings 222. Specifically, the base sheet 210 and the adhesive layer 232 have a light transmitting property. Accordingly, the sheet 200 does not have a light-blocking member between the wirings 222 adjacent to each other. Accordingly, the sheet 200 has a light transmitting property between the wirings 222 adjacent to each other. This enables to form the wirings 222 without deteriorating the light transmitting property of the light emitting system 10. Specifically, it is possible to improve the visibility when the second surface 104 side of the substrate 100 is viewed from the inside of the moving object, that is, from the first surface 102 of the substrate 100. Further, it is possible to improve the design of the vehicle, the light emitting system 10 and the light emitting element 20 of the vehicle, when the light emitting system 10 having the wirings 222 is viewed from inside and outside.

The plurality of wirings 222 is electrically connected in parallel to each other between the conductive portion 224 and the conductive portion 226. The combined conductance of a plurality of resistors connected in parallel is the sum of the conductance of each resistor. Accordingly, even when the cross-sectional area of each of the plurality of wirings 222 is small, the Joule heat generated throughout the plurality of wirings 222 can be reduced if the sum of the sectional area of each of the plurality of wirings 222 is rather large. In other words, a higher number of the plurality of wirings 222 enables to reduce the cross-sectional area (particularly, the width) of each of the plurality of wirings 222. Accordingly, the wiring 222 can be made inconspicuous to human vision.

The width of each wiring 222 is preferably, equal to or less than 1 mm, for example. When the width of the wiring 222 is narrow as described above, the wiring 222 becomes inconspicuous to human vision. Specifically, when the light emitting system 10 is formed in the rear window of the moving object, and the width of each wiring 222 is formed with equal to or less than 0.5 mm which is equal to or less than the human visual resolution at 1.5 m that is an approximate distance of the rear window from the driver's seat, the visibility from the inside of the moving object to the outside can be enhanced.

In the first region in the vicinity of the conductive portion 224, the interval between adjacent wirings 222 increases further away from the conductive portion 224. In the second region in the vicinity of the conductive portion 226, the interval between adjacent wirings 222 increases further away from the conductive portion 226. In the third region between the first region and the second region, the interval between adjacent wirings 222 is constant regardless of the position. In the third region, the adjacent wirings 222 are parallel to each other at a distance of, for example, equal to or greater than 1 mm. In this way, when the wirings 222 are spaced apart from each other at a long distance, the width of the light transmitting property region between the wirings 222 is increased.

The wirings 222 may be formed of a light-reflecting or light-blocking material. For example, the wiring 222 is formed of a material having an optical density of equal to or greater than 3.0 at a thickness of 1 μm, or specifically, it is formed of a metal, for example, or more specifically, it is formed of silver (Ag), copper (Cu) or aluminum (Al), for example. Even when the wiring 222 is formed of such a material, according to the present embodiment, as described above, the width of the wiring 222 may still be narrowed. Accordingly, the wiring 222 becomes inconspicuous to human vision.

As shown in FIG. 3, in a cross-section perpendicular to the extending direction of the wiring 222, the shape of the wiring 222 is rectangular. Rectangle may have the lowest height among any other shape (for example, triangle or circle) when a certain area is occupied with a certain width. Accordingly, in the example shown in FIG. 3, even when the wiring width of the wiring 222 is narrowed, the cross-sectional area of the wiring 222 can be secured without considerably increasing the thickness of the wiring 222. In the example shown in FIG. 3, the thickness of the wiring 222 is equal to or greater than 5 μm, and equal to or less than 40 μm, for example.

The cross-sectional area of each of the conductive portion 224 and the conductive portion 226 is approximately equal to the sum of the cross-sectional areas of the plurality of wirings 222 or greater than the sum of the cross-sectional areas of the plurality of wirings 222. Accordingly, it is possible to reduce Joule heat generated from the conductive portion 224 and the conductive portion 226.

As described above, according to the present embodiment, the plurality of wirings 222 of the first sheet 202 is electrically connected to the anode of the light emitting element 20 or the light emitting portion 142 (the first electrode 110 and the first terminal 112). The plurality of wirings 222 of the second sheet 204 is electrically connected to the cathode of the light emitting element 20 (the second electrode 130 and the second terminal 132). As a result, the width of each wiring 222 of the first sheet 202 can be narrowed. In the same way, the width of each wiring 222 of the second sheet 204 can be narrowed. Accordingly, the wiring 222 can be made inconspicuous to human vision.

Figure 5:
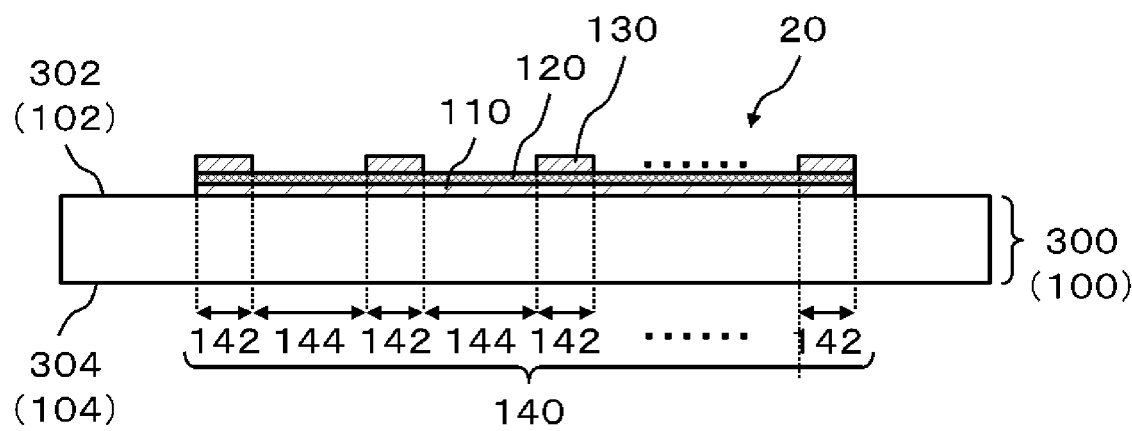
FIG. 5 is a view illustrating a Modification Example of FIG. 1.

FIG. 5 is a view illustrating a Modification Example of FIG. 1. As shown in this figure, the light emitting element 20 does not have a substrate 100 (FIGS. 1 to 4). That is, the plurality of light emitting portions 142 may be formed on the inner surface 302 of the base member 300 without across the substrate 100. In other words, in the example shown in this figure, the base member 300 serves as the substrate 100. Most of the light from the light emitting portion 142 is emitted from the outer surface 304 (the second surface 104 of the substrate 100) side of the base member 300 and the light from the light emitting portion 142 is hardly emitted from the inner surface 302 of the base member 300 (the first surface 102 of the substrate 100) side. In this way, the light from light emitting portion 142 is emitted toward the outside of the vehicle. There are two kinds of methods for forming such a light emitting system 10. One method is to form the light emitting portion 142 directly on the base member 300. The other method is to peel off the light emitting portion 142 formed previously on a separate substrate from the separate substrate and form it on the base member 300. In this case, the light emitting portion 142 is formed using an adhesive, such as resin, having a light transmitting property.

Figure 6:
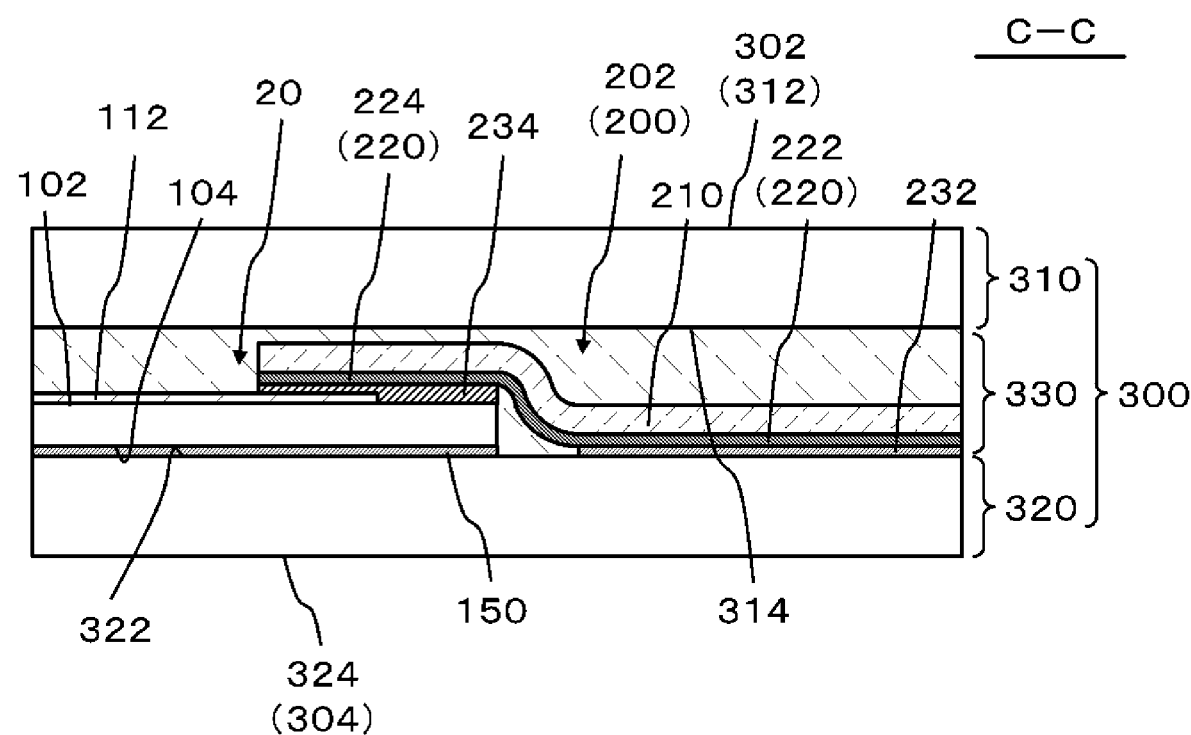
FIG. 6 is a view illustrating a Modification Example of FIG. 4.

FIG. 6 is a view illustrating a Modification Example of FIG. 4. As shown in the figure, the light emitting element 20 (including the cases where the light emitting element 20 does not have the substrate 100, the same applies hereinafter) and the sheet 200 of the light emitting system 10 may be inside the base member 300. The base member 300 is a laminated glass. Specifically, the base member 300 has a first base member 310, a second base member 320 and an intermediate layer 330. The first base member 310 has a surface 312 and a surface 314. The surface 312 serves as the inner surface 302 of the base member 300. The surface 314 is opposite to the surface 312. The second base member 320 has a surface 322 and a surface 324. The surface 324 is on the opposite side of the surface 322 and serves as the outer surface 304 of the base member 300. The intermediate layer 330 is, for example, a resin layer. The first base member 310 and the second base member 320 are joined to each other through the intermediate layer 330 such that the surface 314 of the first base member 310 and the surface 322 of the second base member 320 face each other across the intermediate layer 330.

In the example shown in this figure, the light emitting element 20 and the sheet 200 of the light emitting system 10 are attached to the surface 322 of the second base member 320 and are covered with the intermediate layer 330. The light emitting element 20 is attached to the second base member 320 such that the second surface 104 of the substrate 100 faces the surface 322 of the second base member 320. The light emitting element 20 and the sheet 200 may be attached to the surface 314 of the first base member 310. Most of the light from the light emitting portion 142 is emitted from the second surface 104 side, and light from the light emitting portion 142 is hardly emitted from the first surface 102 side. In this way, light from the light emitting element 20 is emitted toward the outside of the vehicle.

Modification Example 1

Figure 7:
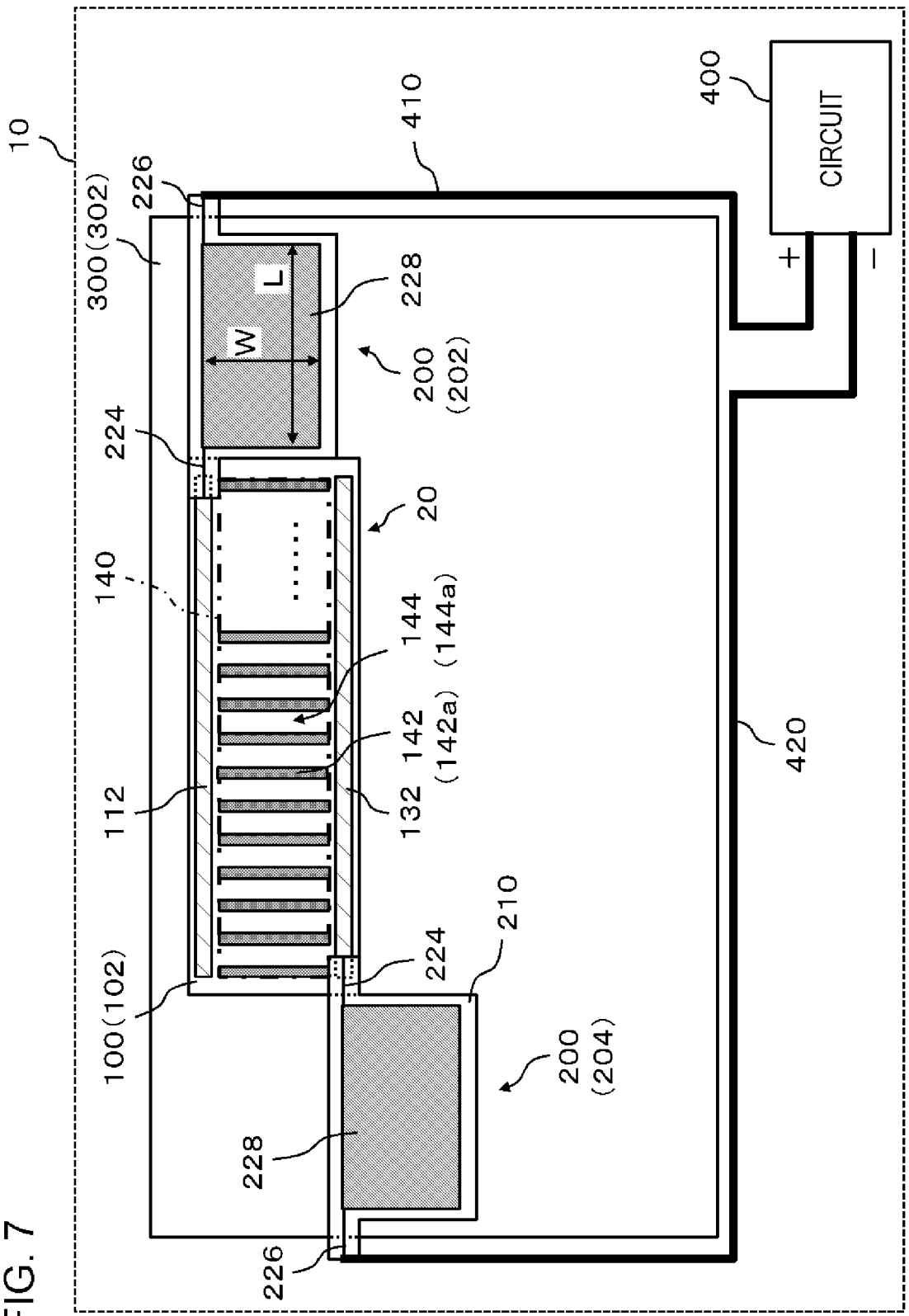
FIG. 7 is a view illustrating a light emitting system according to Modification Example 1.

FIG. 7 is a view illustrating alight emitting system 10 according to Modification Example 1, and corresponds to FIG. 1 of the embodiment. The light emitting system 10 according to this Modification Example is the same as the light emitting system 10 according to the embodiment except for the following details.

In the example shown in this figure, the sheet 200 has a conductive layer 228 instead of a plurality of wirings 222 (FIG. 1). The conductive layer 228 is a metal layer having an extremely thin thickness. Specifically, the conductive layer 228 has a thickness such that the light transmittance of visible light (for wavelengths equal to or greater than 400 nm and equal to or less than 750 nm) is equal to or greater than 50%. More specifically, when the conductive layer 228 is formed of aluminum (Al), the film thickness of the conductive layer 228 is equal to or less than 10 nm, preferably equal to or less than 5 nm. When the conductive layer 228 is formed of silver (Ag), the film thickness of the conductive layer 228 is, for example, equal to or less than 40 nm, or preferably, is equal to or less than 20 nm. As a result, even when the conductive layer 228 is provided on the base member 300, it is possible to suppress light from being blocked by the conductive layer 228.

In the example shown in FIG. 7, the conductive layer 228 is a wide wiring having a length L and a width W. In order to increase the cross-sectional area of the conductive layer 228 to some extent, the width W needs to be increased to some extent. For example, when the conductive layer 228 is formed of silver (Ag) (having electric resistivity of $1.59 \times 10^{-8}$ Ω·m), and the length L of the conductive layer 228 is 0.5 m and the thickness of the conductive layer 228 is 20 nm, the width W of the conductive layer 228 needs to be 39.8 cm for 1Ω resistance of the conductive layer 228.

Modification Example 2

Figure 8:
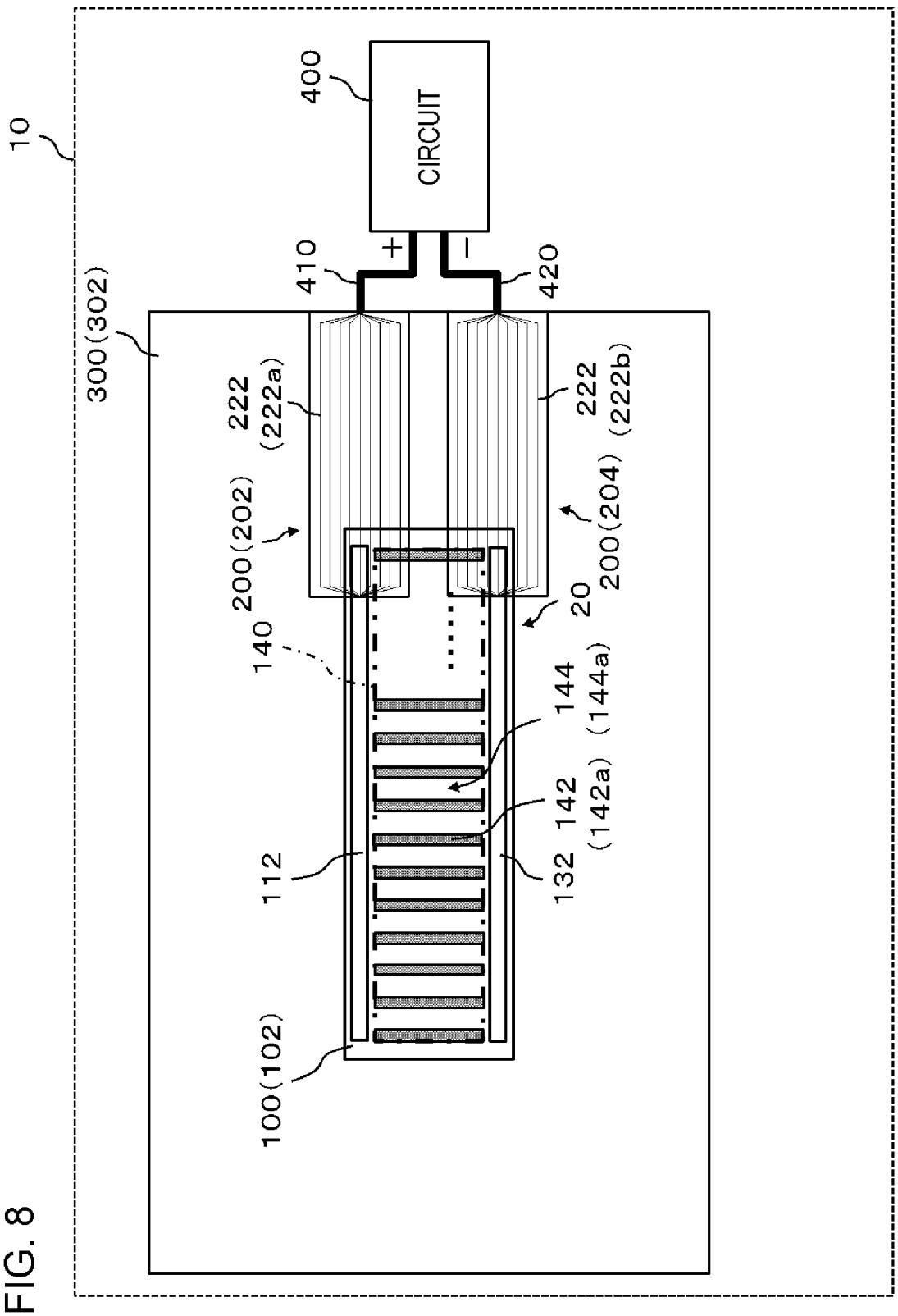
FIG. 8 is a view illustrating a light emitting system according to Modification Example 2.

FIG. 8 is a view illustrating a light emitting system 10 according to Modification Example 2, and corresponds to FIG. 1 of the embodiment. The light emitting system 10 according to this Modification Example is the same as the light emitting system 10 according to the embodiment except for the following details.

The plurality of wirings 222 (wiring 222*a*) of the first sheet 202 extends from the first terminal 112 toward one side of the light emitting element 20 and is connected to the anode wiring 410, and the plurality of wirings 222 (wiring 222*b*) of the second sheet 204 extends from the second terminal 132 toward one side of the light emitting element 20 (that is, the same side as the plurality of wirings 222*a*) and is connected to the cathode wiring 420.

One end of each of the plurality of wirings 222*a* is concentrated at one position of the first terminal 112, and the other end of each of the plurality of wirings 222*a* is concentrated at one position of one end of the anode wiring 410, and the adjacent wirings 222*a* are spaced apart from each other between the one end and the other end. Accordingly, between the one end and the other end, the light can be transmitted through the region between the adjacent wirings 222*a*.

One end of each of the plurality of wirings 222*b* is concentrated at one position of the second terminal 132 and the other end of each of the plurality of wirings 222*b* is concentrated at one position of one end of the cathode wiring 420, and the adjacent wirings 222*b* are spaced apart from each other between the one end and the other end. Accordingly, between the one end and the other end, the light can be transmitted through the region between the adjacent wirings 222*b*.

Modification Example 3

Figure 9:
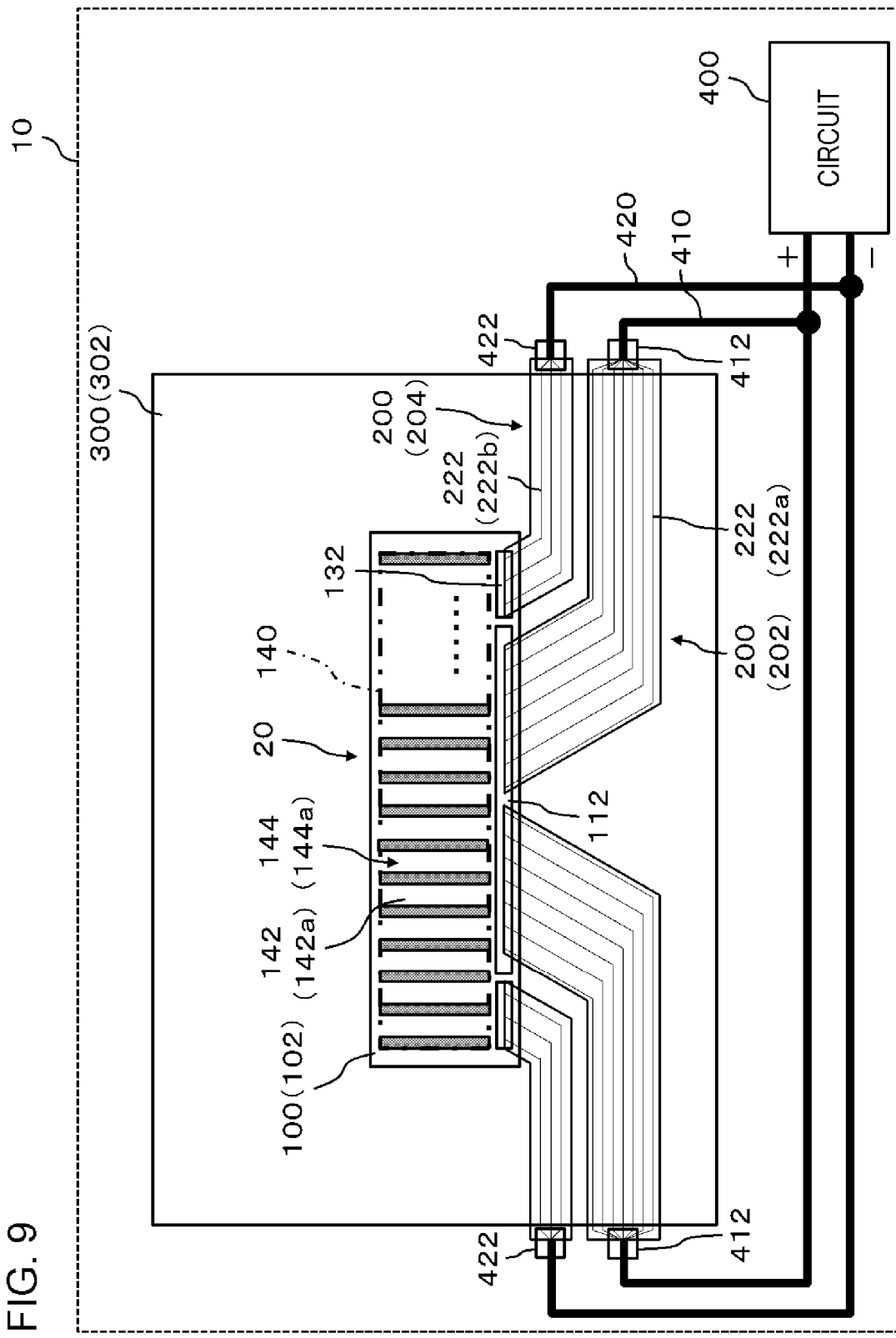
FIG. 9 is a view illustrating a light emitting system according to Modification Example 3.

FIG. 9 is a view illustrating alight emitting system. 10 according to Modification Example 3, and corresponds to FIG. 1 of the embodiment. The light emitting system 10 according to this Modification Example is the same as the light emitting system 10 according to the embodiment except for the following details.

In the example shown in FIG. 9, both the first terminal 112 and the second terminal 132 are located on one side of the semi-transmissive light emitting region 140, and more specifically, they are arranged along the long side of the semi-transmissive light emitting region 140. Specifically, in the example shown in FIG. 9, the first terminal 112 is located between the two second terminals 132.

Each of the plurality of wirings 222 (wirings 222*a*) of the first sheet 202 is in contact with each of a plurality of spaced-apart positions of the first terminal 112 (anode). That is, the plurality of wirings 222*a* is not concentrated at a specific position of the first terminal 112, and thus it is possible to suppress a decrease in light transmitting property due to concentration of the plurality of wirings 222*a* in the vicinity of the first terminal 112.

In the example shown in FIG. 9, the plurality of positions of the plurality of the wirings 222*a* is substantially equally apart along the extending direction of the first terminal 112. Accordingly, it is possible to suppress the voltage drop along the extending direction of the first terminal 112, thereby suppressing variation in brightness of the semi-transmissive light emitting region 140.

Each of the plurality of wirings 222 (wirings 222*b*) of the second sheet 204 is in contact with each of a plurality of spaced-apart positions of the second terminal 132 (cathode). That is, the plurality of wirings 222*b* is not concentrated at a specific position of the second terminal 132, and thus it is possible to suppress a decrease in light transmitting property due to concentration of the plurality of wirings 222*b* in the vicinity of the second terminal 132.

In the example shown in FIG. 9, the plurality of positions of the plurality of wirings 222*b* is substantially equally apart along the extending direction of the second terminal 132. Accordingly, it is possible to suppress the voltage drop along the extending direction of the second terminal 132, thereby suppressing variation in brightness of the semi-transmissive light emitting region 140.

In the example shown in FIG. 9, some wiring 222 of the plurality of wirings 222 extends toward one side of the light emitting element 20 and some other wiring 222 of the plurality of wirings 222 extends toward the other side of the light emitting element 20. Specifically, in the example shown in FIG. 9, the plurality of wirings 222*a* of the first sheet 202 and the plurality of wirings 222*b* of the second sheet 204 on one side of the light emitting element 20 are connected to the anode wiring 410 and the cathode wiring 420 through the first external terminal 412 and the second external terminal 422 respectively on the one side of the light emitting element 20, and the plurality of wirings 222*a* of the first sheet 202 and the plurality of wirings 222*b* of the second sheet 204 on the other side of the light emitting element 20 are connected to the anode wiring 410 and the cathode wiring 420 through the first external terminal 412 and the second external terminal 422 respectively on the other side of the light emitting element 20.

Figure 10:
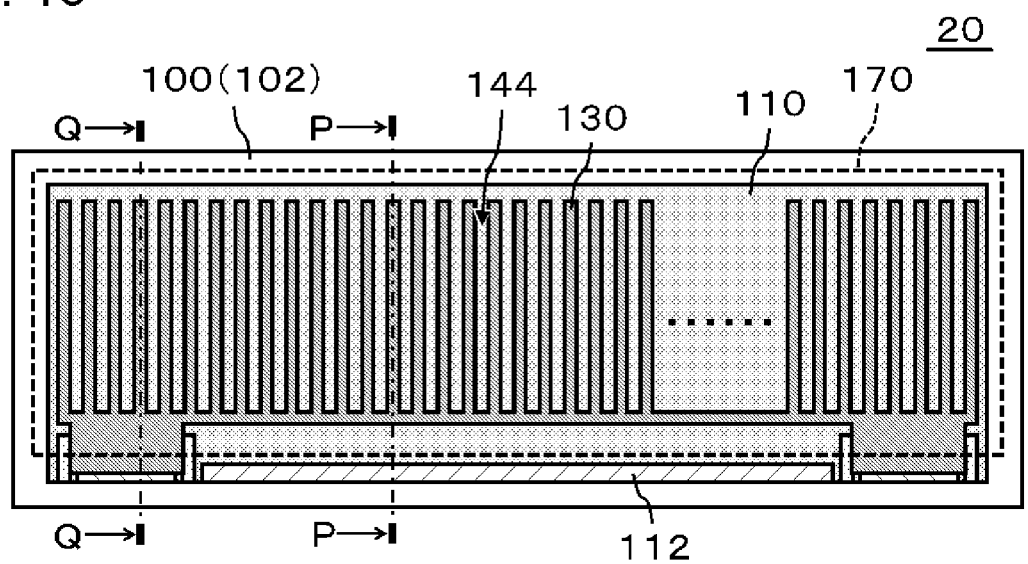
FIG. 10 is a plan view illustrating an example of details of the light emitting element shown in FIG. 9.
Figure 11:
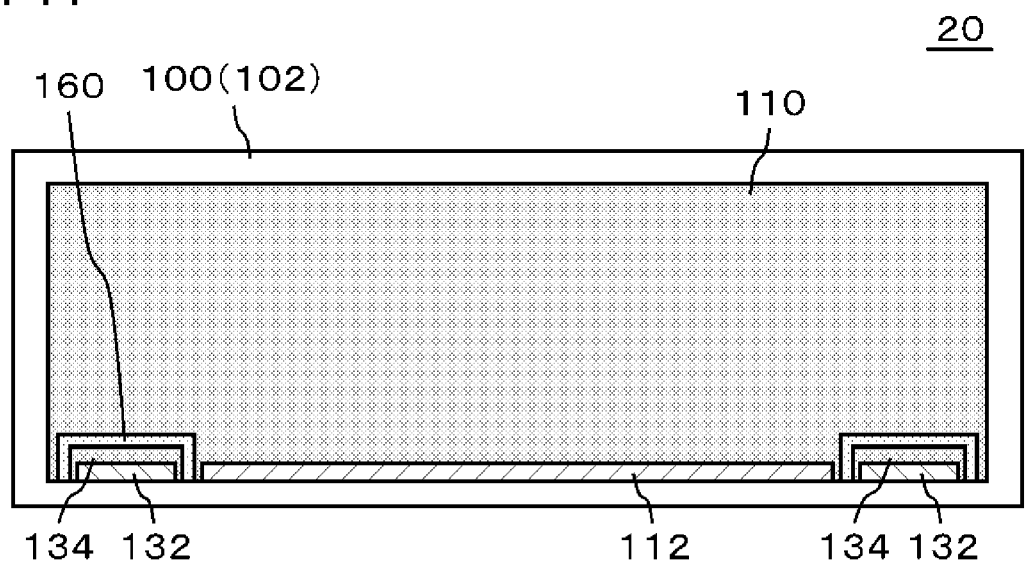
FIG. 11 is a view in which a second electrode and a sealing portion are removed from FIG. 10.
Figure 12:
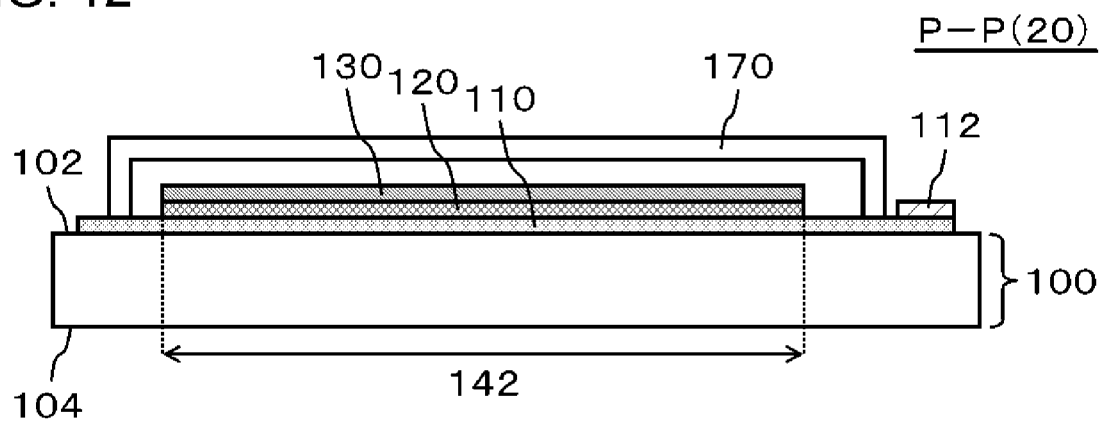
FIG. 12 is a cross-sectional view taken along line P-P in FIG. 10.
Figure 13:
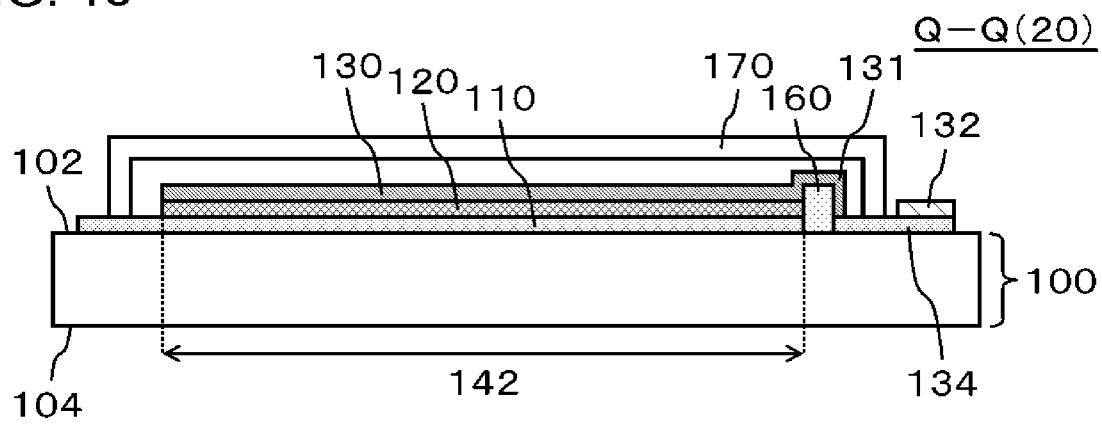
FIG. 13 is a cross-sectional view taken along line Q-Q in FIG. 10.

FIG. 10 is a plan view illustrating an example of details of the light emitting element 20 shown in FIG. 9. FIG. 11 is a view in which the second electrode 130 and the sealing portion 170 are removed from FIG. 10. FIG. 12 is a cross-sectional view taken along line P-P in FIG. 10. FIG. 13 is a cross-sectional view taken along line Q-Q in FIG. 10. For the sake of easy of description, the organic layer 120 is not shown in FIG. 10.

In the example shown in FIGS. 10 to 13, the light emitting element 20 includes a connecting portion 134, an insulating portion 160, and a sealing portion 170.

As shown in FIG. 13, the connecting portion 134 electrically connects the second electrode 130 and the second terminal 132 to each other. The connecting portion 134 is formed of the same material as that of the first electrode 110, that is, it is formed of a conductive material having a light transmitting property.

As shown in FIGS. 11 and 13, the insulating portion 160 separates the first electrode 110 and the connecting portion 134 from each other. Accordingly, a short circuit between the first electrode 110 and the connecting portion 134 is prevented.

As shown in FIGS. 12 and 13, the sealing portion 170 seals the light emitting portion 142. Specifically, in the example shown in FIGS. 12 and 13, the sealing portion 170 covers the light emitting portion 142 across a hollow region. Accordingly, this hollow region seals the light emitting portion 142 from the external area.

In the example shown in FIGS. 10 to 13, the first terminal 112 is electrically connected to the first electrode 110, and the second terminal 132 is electrically connected to the second electrode 130 through the connecting portion 134. Specifically, as shown in FIG. 12, the first terminal 112 is located on the first electrode 110 outside the sealing portion 170, and as shown in FIG. 13, the second terminal 132 is located on the connecting portion 134 outside the sealing portion 170. As shown in FIG. 13, the second electrode 130 is connected to the conductive layer 131 integrated with the second electrode 130, and the conductive layer 131 extends across the insulating portion 160 to the connecting portion 134. In this way, the first terminal 112 is electrically connected to the first electrode 110, and the second terminal 132 is electrically connected to the second electrode 130 through the connecting portion 134.

In the example shown in FIGS. 10 to 13, the light emitting element 20 has a light transmitting property. Specifically, as shown in FIG. 10, a plurality of second electrodes 130 is arranged in stripe shape. Accordingly, the area between the adjacent second electrodes 130 is the light transmitting portion 144. Accordingly, the light emitting element 20 has alight transmitting property. In another example, the second electrode 130 may extend almost throughout the region overlapping with the first electrode 110, and in this case, the light emitting element 20 may serve as a surface light source having no light transmitting property.

In the example shown in FIG. 11, the first terminal 112 and the second terminal 132 are arranged on one side of the light emitting element 20, specifically, the first terminal 112 and the second terminal 132 are arranged along the long side of the substrate 100. Specifically, in the example shown in FIG. 11, the connecting portion 134 is electrically and physically separated apart from the first electrode 110 by the insulating portion 160. Accordingly, a short circuit between the first electrode 110 and the connecting portion 134 is prevented.

Modification Example 4

Figure 14:
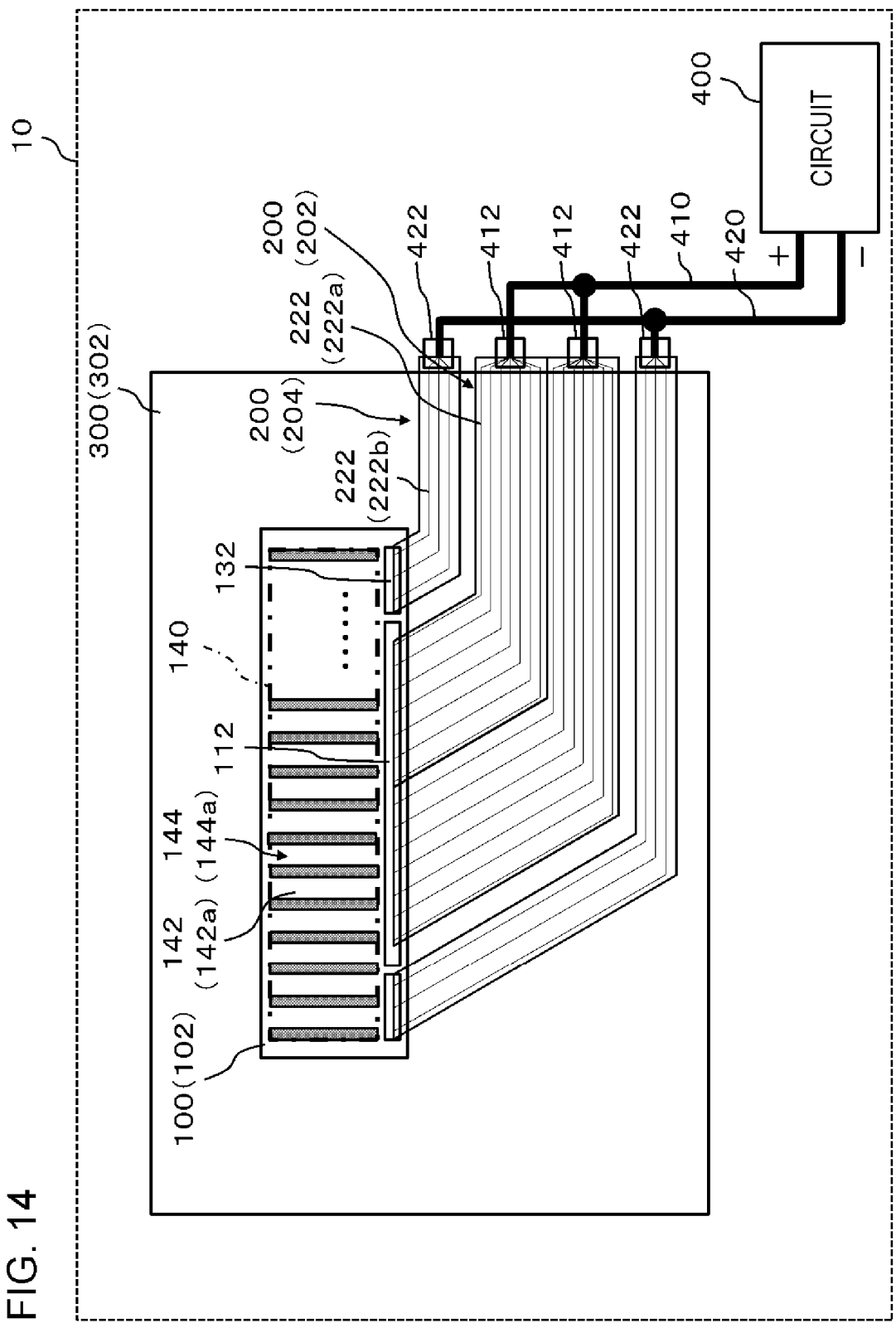
FIG. 14 is a view illustrating a light emitting system according to Modification Example 4.

FIG. 14 is a view illustrating a light emitting system 10 according to Modification Example 4, and corresponds to FIG. 9 of Modification Example 3. The light emitting system 10 according to this Modification Example is the same as the light emitting system 10 according to Modification Example 3 except for the following details.

In the example shown in FIG. 14, all of the plurality of wirings 222 extend toward one side of the light emitting element 20. Specifically, in the example shown in FIG. 14, the plurality of wirings 222a of each of the first sheets 202 and the plurality of wirings 222b of each second sheet 204 are connected to the anode wiring 410 and the cathode wiring 420 through the first external terminal 412 and the second external terminal 422 respectively on one side of the light emitting element 20.

Modification Example 5

Figure 15:
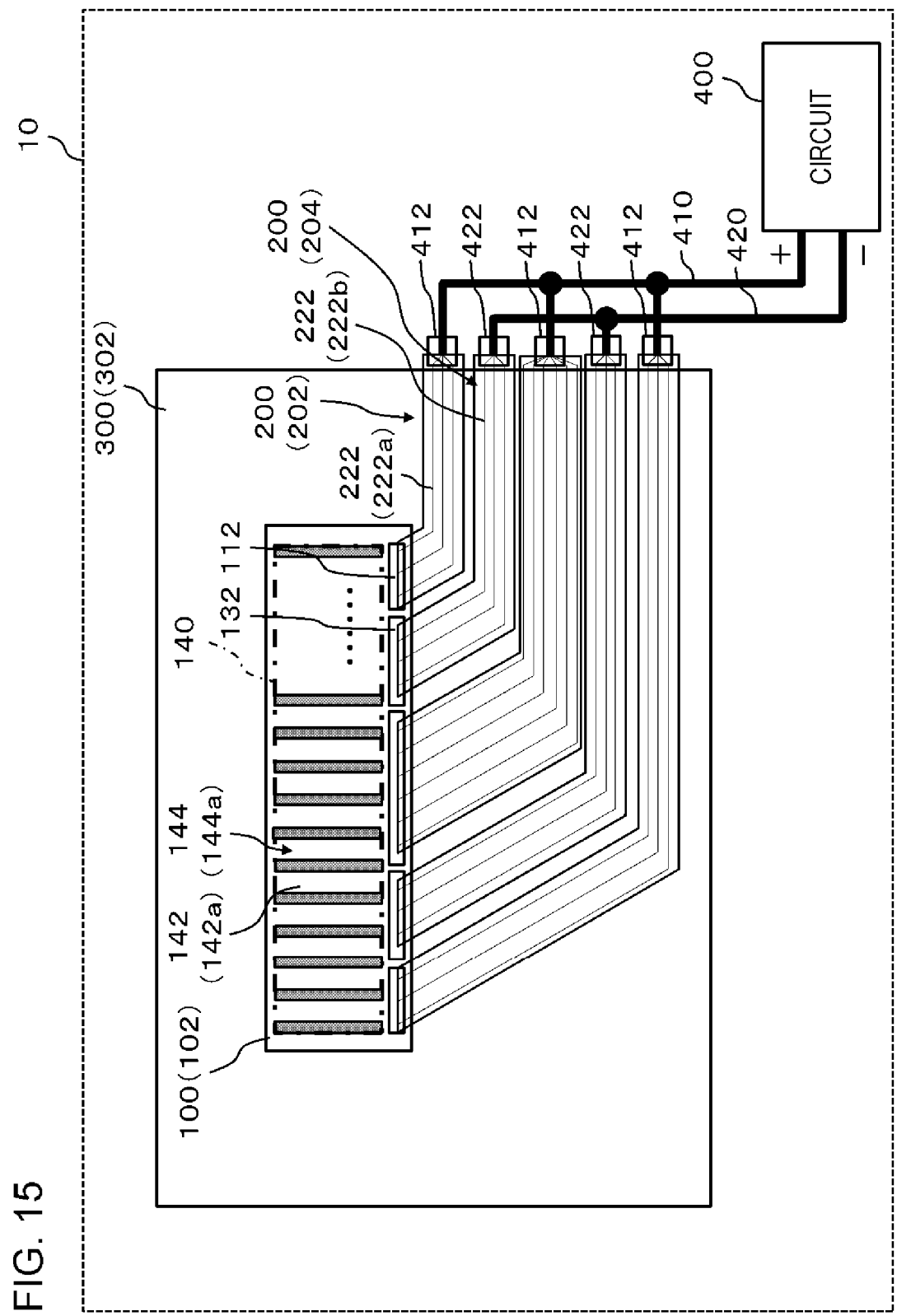
FIG. 15 is a view illustrating a light emitting system according to Modification Example 5.

FIG. 15 is a view illustrating a light emitting system 10 according to Modification Example 5, and corresponds to FIG. 9 of Modification Example 3. The light emitting system 10 according to this Modification Example is the same as the light emitting system 10 according to Modification Example 3 except for the following details.

In the example shown in FIG. 15, a plurality of first terminals 112 and a plurality of second terminals 132 are alternately arranged along one direction. Specifically, in the example shown in FIG. 15, each of the plurality of first sheets 202 is attached to each of the plurality of first terminals 112, and each of the plurality of second sheets 204 is attached to each of the plurality of second terminals 132. In the same way as the example shown in FIG. 14, all of the plurality of wirings 222 extend toward one side of the light emitting element 20.

Modification Example 6

Figure 16:
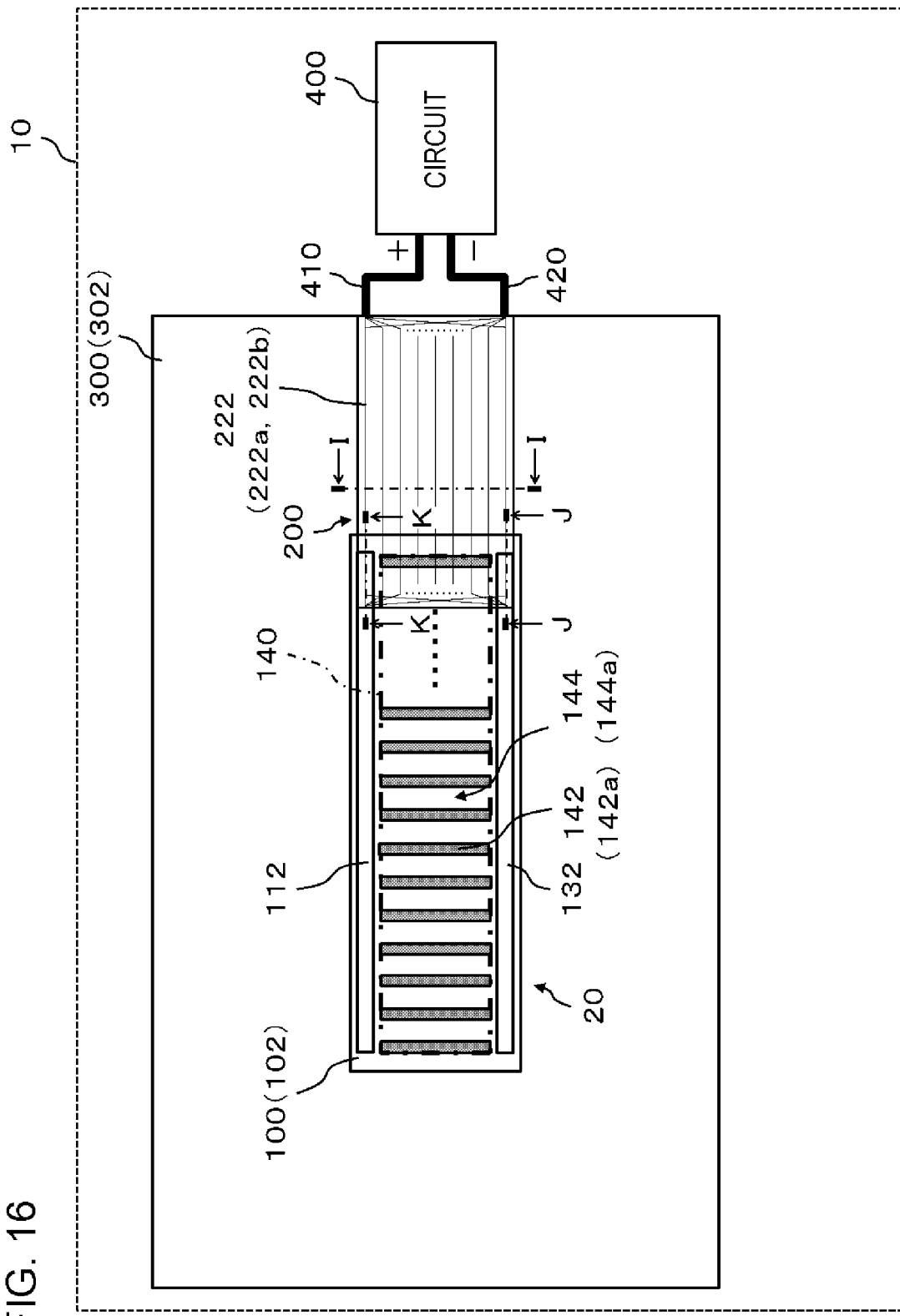
FIG. 16 is a view illustrating a light emitting system according to Modification Example 6.
Figure 17:
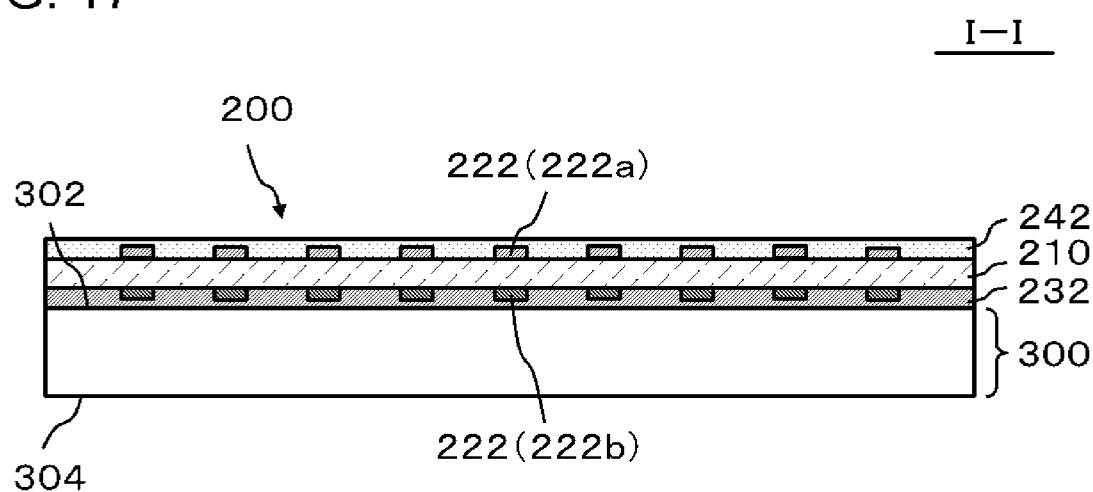
FIG. 17 is a cross-sectional view taken along line I-I in FIG. 16.
Figure 18:
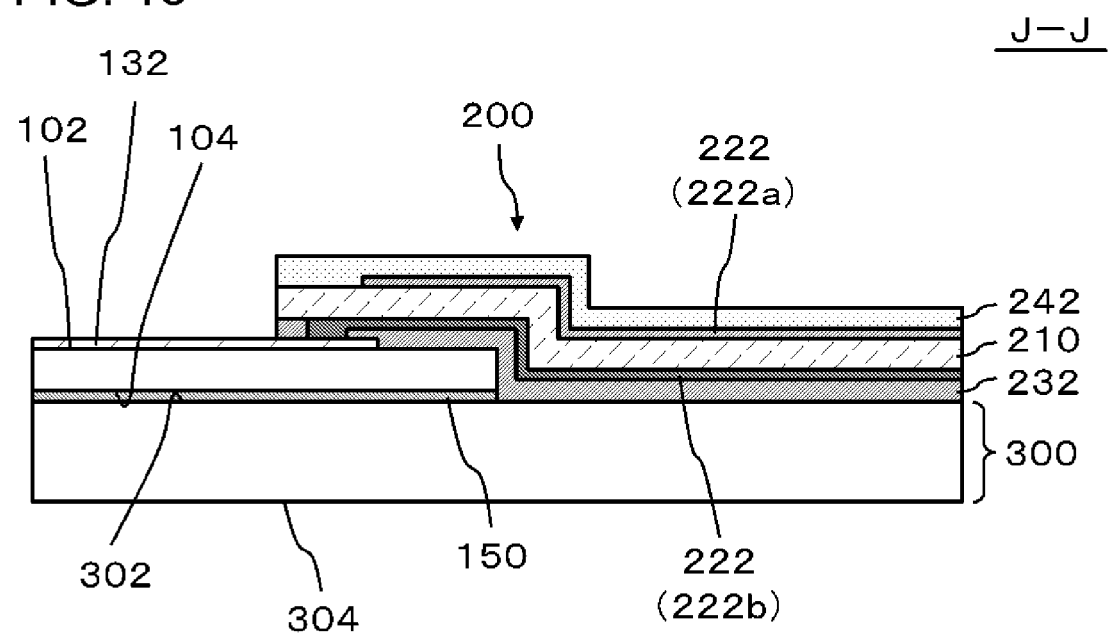
FIG. 18 is a cross-sectional view taken along line J-J in FIG. 16.
Figure 19:
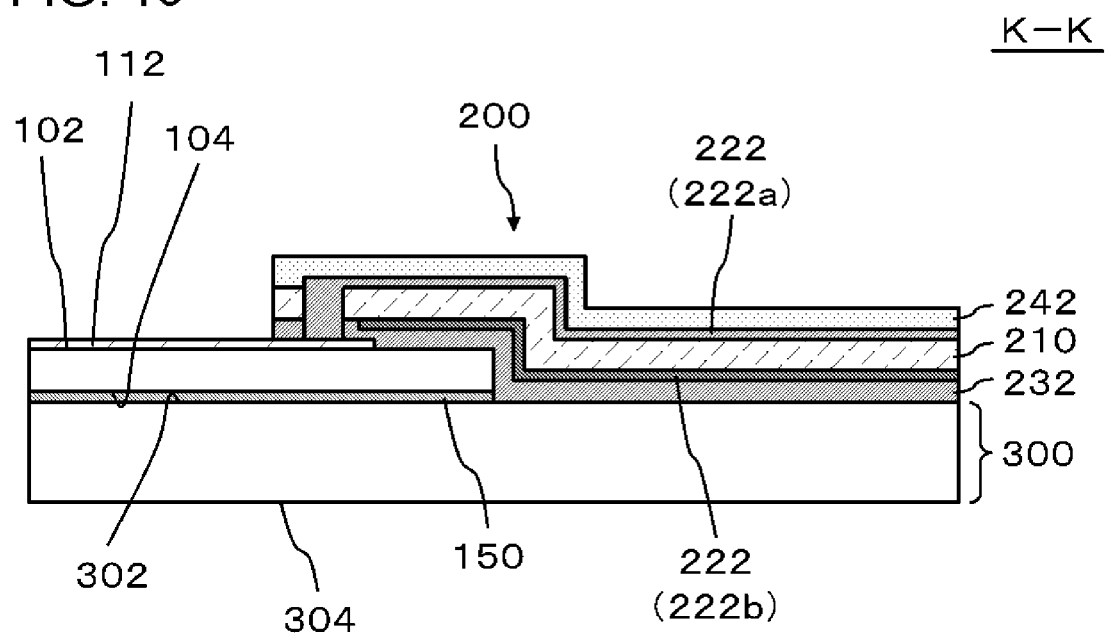
FIG. 19 is a cross-sectional view taken along line K-K in FIG. 16.

FIG. 16 is a view illustrating a light emitting system 10 according to Modification Example 6, and corresponds to FIG. 1 of the embodiment. FIG. 17 is a cross-sectional view taken along line I-I in FIG. 16. FIG. 18 is a cross-sectional view taken along line J-J in FIG. 16. FIG. 19 is a cross-sectional view taken along line K-K in FIG. 16. The light emitting system 10 according to this Modification Example is the same as the light emitting system 10 according to the embodiment except for the following details.

As shown in FIGS. 16 to 19, especially in FIG. 17, in this Modification Example, each of the plurality of wirings 222a overlaps with each of the plurality of wirings 222b in a direction perpendicular to the base member 300. Accordingly, when viewed from a direction perpendicular to the base member 300, the plurality of wirings 222a and the plurality of wirings 222b can be arranged in a narrow region. In other words, the light emitting system 10 can be formed without deteriorating light transmitting property of the light emitting system 10, as compared with the case where the wiring 222a and the wiring 222b are arranged side by side.

As shown in FIG. 17, the sheet 200 has abase sheet 210, a plurality of wirings 222a, a plurality of wirings 222b, an adhesive layer 232 and a protective layer 242. The base sheet 210 has an insulating property and is located between the plurality of wirings 222a and the plurality of wirings 222b. Accordingly, the plurality of wirings 222a and the plurality of wirings 222b are electrically insulated by the base sheet 210. In the example shown in FIG. 17, the plurality of wirings 222a is located further away from the inner surface 302 of the base member 300 than the plurality of wirings 222b. Specifically, the plurality of wirings 222a is covered with a protective layer 242, and the plurality of wirings 222b is covered with the adhesive layer 232. The plurality of wirings 222b may be located further away from the inner surface 302 of the base member 300 than the plurality of wirings 222a, in this case, the plurality of wirings 222b is covered with the protective layer 242, and the plurality of wirings 222a is covered with the adhesive layer 232.

As shown in FIG. 18, in the vicinity of the second terminal 132, the wiring 222b is in contact with the second terminal 132 through the adhesive layer 232. In this way, the wiring 222b is electrically connected to the second terminal 132.

As shown in FIG. 19, in the vicinity of the first terminal 112, the wiring 222a is in contact with the first terminal 112 through the base sheet 210 and the adhesive layer 232. In this way, the wiring 222a is electrically connected to the first terminal 112.

Modification Example 7

Figure 20:
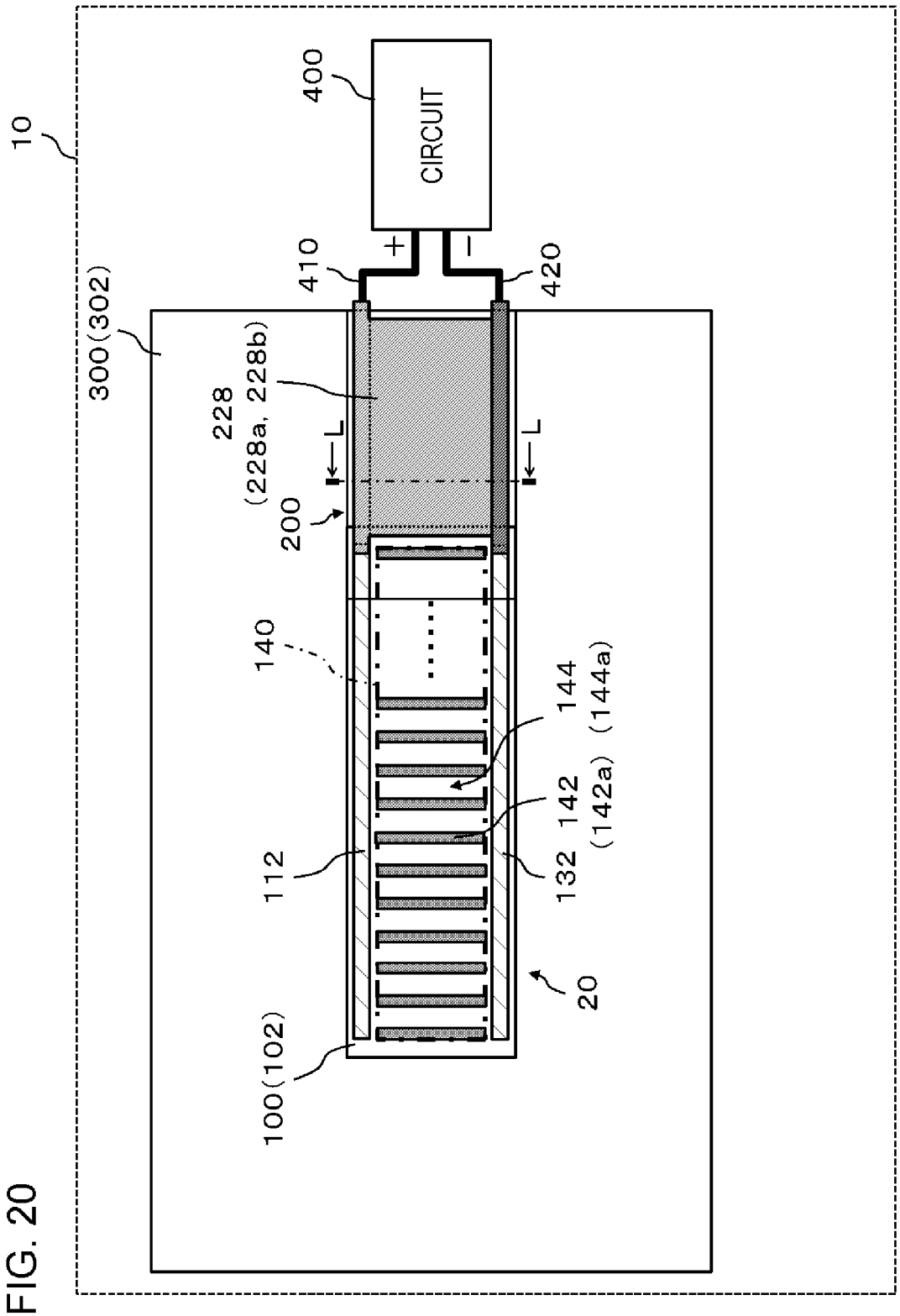
FIG. 20 is a view illustrating a light emitting system according to Modification Example 7.
Figure 21:
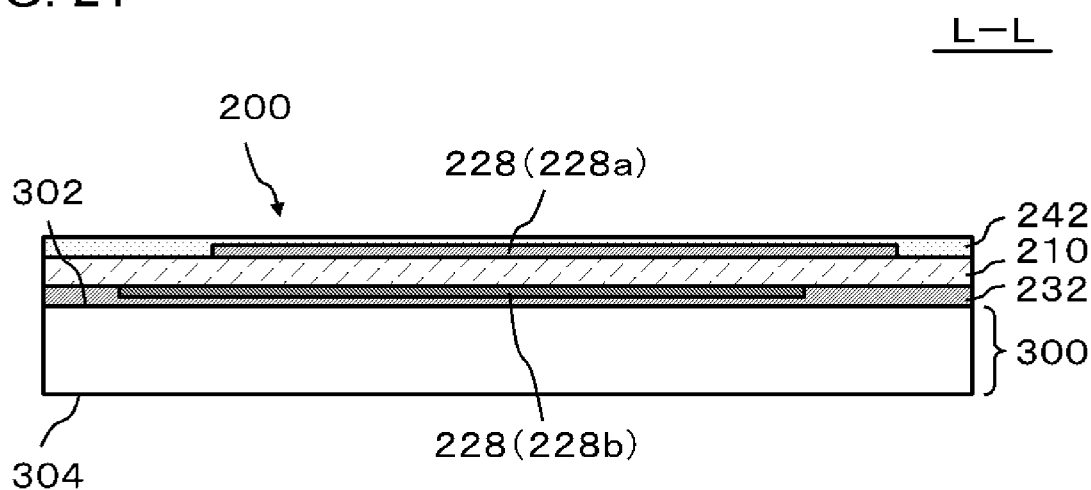
FIG. 21 is a cross-sectional view taken along line L-L in FIG. 20.

FIG. 20 is a view illustrating a light emitting system 10 according to Modification Example 7, and corresponds to FIG. 7 of Modification Example 1. FIG. 21 is a cross-sectional view taken along line L-L in FIG. 20. The light emitting system 10 according to this Modification Example is the same as the light emitting system 10 according to Modification Example 1 except for the following details.

The sheet 200 includes two conductive layers 228, that is, a conductive layer 228a and a conductive layer 228b, and the conductive layer 228a is electrically connected to the first terminal 112, and the conductive layer 228b is electrically connected to the second terminal 132. The conductive layer 228a and the conductive layer 228b are metal layers having extremely thin film thicknesses, likewise the conductive layer 228 shown in FIG. 7. Accordingly, a certain amount of visible light can be transmitted through the conductive layer 228a and the conductive layer 228b.

As shown in FIGS. 20 and 21, especially in FIG. 21, in this Modification Example, the conductive layer 228a overlaps with the conductive layer 228b in a direction perpendicular to the base member 300. Accordingly, when viewed from a direction perpendicular to the base member 300, the conductive layer 228a and the conductive layer 228b can be disposed in a narrow region. In other words, the light emitting system 10 can be formed without deteriorating light transmitting property of the light emitting system 10, as compared with the case where the conductive layer 228a and the conductive layer 228b are arranged side by side.

As shown in FIG. 21, the sheet 200 has abase sheet 210, a conductive layer 228a, a conductive layer 228b, an adhesive layer 232, and a protective layer 242. The base sheet 210 has insulating property and is located between the conductive layer 228a and the conductive layer 228b. Accordingly, the conductive layer 228a and the conductive layer 228b are electrically insulated by the base sheet 210. In the example shown in FIG. 21, the conductive layer 228a is located further away from the inner surface 302 of the base member 300 than the conductive layer 228b. Specifically, the conductive layer 228a is covered with the protective layer 242, and the conductive layer 228b is covered with the adhesive layer 232. The conductive layer 228b may be located further away from the inner surface 302 of the base member 300 than the conductive layer 228a, in this case, the conductive layer 228b is covered with the protective layer 242, and the conductive layer 228a is covered with the adhesive layer 232.

Likewise the wiring 222b shown in FIG. 18, in the vicinity of the second terminal 132, the conductive layer 228b is in contact with the second terminal 132 through the adhesive layer 232. In this way, the conductive layer 228b is electrically connected to the second terminal 132.

In the same way as the wiring 222a shown in FIG. 19, in the vicinity of the first terminal 112, the conductive layer 228a is in contact with the first terminal 112 through the base sheet 210 and the adhesive layer 232. In this way, the conductive layer 228a is electrically connected to the first terminal 112.

Although the embodiments and examples have been described with reference to the drawings, these are merely examples of the present invention, and various configurations other than the above may be adopted.

This application claims priority based on Japanese Patent Application No. 2016-087482 filed on Apr. 25, 2016, the disclosure of which is incorporated herein in its entirety.

The invention claimed is:

1. A light emitting system comprising:
 a base member having a light transmitting property;
 a light emitting portion located over a surface of the base member or inside the base member;
 a light transmitting portion located over the surface of the base member or inside the base member;
 a plurality of first wirings located over the surface of the base member or inside the base member and electrically connected to one anode or one cathode of the light emitting portion, and
 a circuit supplying electric power to at least one of the one anode or the one cathode,
 wherein the plurality of first wirings electrically connects the circuit and the one anode or the one cathode,
 wherein each first wiring of the plurality of first wirings comprises a first end and a second end and at least the first ends of the plurality of first wirings are connected to each other,
 wherein the one anode or the one cathode is of light-reflecting,
 wherein the first ends of the plurality first wirings are electrically connected to the one anode or one cathode of the light emitting portion,
 wherein the second ends of the plurality of first wirings are connected to each other.

2. The light emitting system according to claim 1, wherein a region between adjacent first wirings of the plurality of first wirings is a light transmitting region.

3. The light emitting system according to claim 1, further comprising:
 a plurality of second wirings located over the surface of the base member or inside the base member and electrically connected to the other of the one anode or the one cathode of the light emitting portion.

4. The light emitting system according to claim 3, wherein a region between adjacent second wirings of the plurality of second wirings is a light transmitting region.

5. The light emitting system according to claim 4, wherein the plurality of first wirings is formed of metal.

6. The light emitting system according to claim 3, wherein each of the plurality of first wirings overlaps with each of the plurality of second wirings in a direction perpendicular to the base member.

7. The light emitting system according to claim 6, further comprising:
 a base sheet having an insulating property and located between the plurality of first wirings and the plurality of second wirings.

8. The light emitting system according to claim 3, wherein each second wiring of the plurality of second wirings comprises a third end and a fourth end and at least the third ends of the plurality of second wirings are connected to each other, wherein the third ends of the plurality second wirings are electrically connected to the other of the one anode or the one cathode of the light emitting portion, wherein the fourth ends of the plurality of second wirings are connected to each other.

9. The light emitting system according to claim 1, wherein each of the first wirings is formed of a material having an optical density of equal to or greater than 3.0 at a thickness of 1 µm.

10. The light emitting system according to claim 1, wherein the plurality of first wirings is electrically connected in parallel to each other.

11. The light emitting system according to claim 1, wherein a shape of each of the first wirings is rectangular in a section perpendicular to an extending direction of the plurality of first wirings.

12. The light emitting system according to claim 1, wherein the base member is mounted over a moving object, and light from the light emitting portion is emitted toward an outside of the moving object.

13. The light emitting system according to claim 1, wherein each of the plurality of first wirings is in contact with each of a plurality of spaced-apart positions of the one anode or the one cathode.

14. The light emitting system according to claim 13, wherein the plurality of positions is spaced substantially equally apart.

15. The light emitting system according to claim 13, wherein the one of the anode or the cathode extends in one direction, and the plurality of positions is arranged along the one direction.

* * * * *